(12) United States Patent
Eliason

(10) Patent No.: US 6,275,425 B1
(45) Date of Patent: Aug. 14, 2001

(54) FERROELECTRIC VOLTAGE BOOST CIRCUITS

(75) Inventor: Jarrod Eliason, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/714,879

(22) Filed: Nov. 16, 2000

(51) Int. Cl.[7] ..................................................... G11C 7/12
(52) U.S. Cl. ............... 365/189.11; 365/145; 365/189.09; 365/149; 365/194; 365/195; 365/226; 327/534; 327/535; 327/537; 327/530
(58) Field of Search .............................. 365/145, 189.09, 365/189.11, 194, 195, 189.07, 226, 228, 149; 327/530, 534, 535, 537, 538, 543

(56) References Cited

U.S. PATENT DOCUMENTS

| 5,598,366 | 1/1997 | Kraus et al. ........................ 365/145 |
| 5,774,392 | 6/1998 | Kraus et al. ........................ 365/145 |
| 5,854,568 | 12/1998 | Moscaluk ............................ 327/537 |
| 5,896,042 | * 4/1999 | Nishimura et al. .................... 326/38 |
| 5,999,461 | 12/1999 | Verhaeghe et al. ............. 365/189.11 |
| 6,087,687 | * 7/2000 | Katoh ................................... 257/295 |
| 6,141,237 | * 10/2000 | Eliason et al. ........................ 365/145 |

\* cited by examiner

*Primary Examiner*—Andrew Q. Tran
(74) *Attorney, Agent, or Firm*—Peter J. Meza, Esq.; Hogan & Hartson, LLP.

(57) ABSTRACT

A boost circuit for a ferroelectric memory operated in a low voltage supply environment is achieved by floating a local supply voltage and using a single boost via one or more appropriately sized ferroelectric boost capacitors to elevate the local supply level to the desired boosted voltage. When boosting is not required, the local supply voltage is tied to the system external power supply through an appropriately sized PMOS transistor.

20 Claims, 8 Drawing Sheets

FERROELECTRIC VOLTAGE BOOST CIRCUITS

BACKGROUND OF THE INVENTION

This invention relates generally to non-volatile ferroelectric memories. More particularly, the present invention relates to voltage boosting circuitry that enables extremely low voltage operation of non-volatile ferroelectric memories.

Non-volatile memories based on ferroelectric materials are becoming increasingly popular due to their advantages over floating-gate non-volatile memory technologies. The primary advantages of ferroelectric nonvolatile memories are low write voltage (less than five volts versus greater than ten volts for competing technologies), fast write time (less than 100 ns versus volts for competing technologies), fast write time (less than 100 ns versus greater than 1 ms) and low power consumption (charge-based read/write versus current-based read/write). Historically, ferroelectric materials have been developed for integrated circuits energized with a five volt power supply. volts for competing technologies), fast write time (less than 100 ns versus In recent years, a large migration has occurred to 3.3 volt system power supplies. While ferroelectric memory manufacturers have worked to develop production worthy three volt materials, more and more designs are now migrating to 1.8 volt supplies and even lower voltage supplies. Current designs using available ferroelectric materials and conventional ferroelectric memory architectures are inoperable using these 1.8 volt systems because there is simply not enough voltage to generate practically detectable amounts of switched charge.

What is desired, therefore, is a circuit design and architecture for a ferroelectric memory that enables reliable low voltage power supply operation (such as 1.8 volt power supply operation) using state-of-the-art 3.3 volt and other higher-voltage compatible ferroelectric materials.

SUMMARY OF THE INVENTION

It is, therefore, a principal object of the present invention to improve low voltage power supply operation in a ferroelectric memory.

It is another object of the invention to allow ferroelectric materials developed for use with 3.3 volt and five volt power supplies to be used at lower voltages such as 1.8 volts.

It is an advantage of the invention that the CMOS implementation of the present invention allows for uninhibited operation to 2.7 volts and below, even with integrated circuit processes designed for five volt operation. The basic circuitry of the present invention can be expanded if desired to provide real-time variation in boosted voltage levels, which may become important in wide voltage range designs. One-shot boosting as taught in the present invention draws significantly less current than a free-running charge pump and is immediately available upon power-up. When combined with level-translating decoders, a global or local boosted voltage is generated and routed throughout the memory employing significant die area savings and improved control of the boosted voltage level.

According to the present invention, the disclosed circuits enable 1.8 volt designs to be implemented using the state-of-the-art generation of three-volt ferroelectric films. Furthermore, they offer an alternative to conventional wordline boosting circuits, which cease to operate when the power supply voltage falls below approximately two times a body-effected N-channel threshold voltage. The disclosed boost circuits operate well at low voltages and can take advantage of the high dielectric constant of ferroelectric materials to reduce circuit area.

In the ferroelectric memory circuit, the node requiring voltage boosting is tied to the system supply through a PMOS transistor until voltage boosting is required. The rising edge of a boost control signal disconnects the node to be boosted from the power supply, and the node is capacitively boosted using ferroelectric capacitors. In one embodiment, the level of boost is controlled by selecting the number and size of the boost capacitors. The voltage boost circuit is used to generate a global or local boosted voltage level. In another embodiment, a charge pool method of boosted voltage sharing is used.

The foregoing and other objects, features and advantages of the invention will become more readily apparent from the following detailed description of a preferred embodiment of the invention which proceeds with reference to the accompanying drawings.

DETAILED DESCRIPTION

Figure 1:
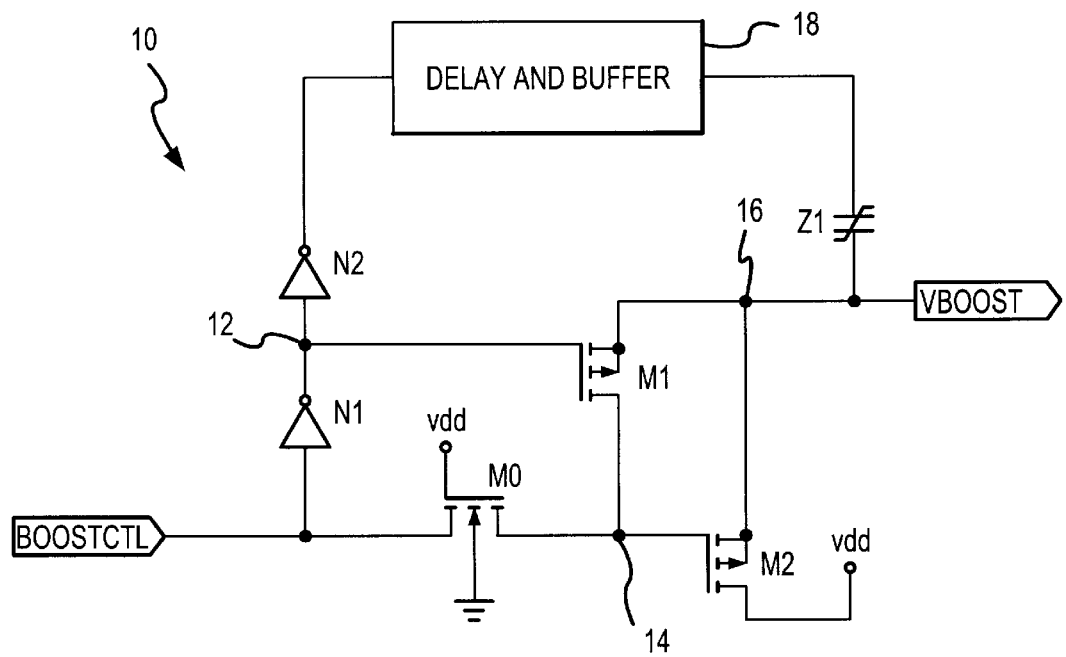
FIG. 1 is a schematic diagram of a first embodiment of a ferroelectric voltage boost circuit according to the present invention.

The basic boost circuit 10 is shown in FIG. 1. The operating signals for boost circuit 10 include an unboosted input control signal BOOSTCTL, and a boosted output signal VBOOST. Boost circuit 10 is energized through the VDD power supply voltage and ground. The current path of N-channel transistor M0 is coupled between the BOOSTCTL input node and circuit node 14, the gate being coupled to the VDD node. The current path of P-channel transistor M1 is coupled between circuit nodes 14 and 16, and the gate is coupled to circuit node 12. The current path of P-channel transistor M2 is coupled between circuit node 16 (VBOOST output node) and VDD, and the gate is coupled to circuit node 14. A pair of inverters N1 and N2 are serially coupled between the BOOSTCTL input node and the input of a delay and buffer circuit 18. The output of delay and buffer circuit 18 is coupled to one terminal of ferroelectric capacitor Z1. The other terminal of ferroelectric capacitor Z1 is coupled to VBOOST output node 16.

When boosting is not required, the BOOSTCTL signal is held low. With BOOSTCTL low and the gate of M0 always forced to VDD, the N-channel transistor M0 is on, and the gate of transistor M2 is pulled low. With the gate of P-channel transistor M2 low, transistor M2 is on and the VBOOST output signal is pulled up to the supply level, VDD.

Inverter N1 inverts the BOOSTCTL signal so that P-channel transistor M1 is off (gate high) when the BOOSTCTL signal is low, and is turned on when BOOSTCTL goes high. Inverter N2 restores the original sense of the BOOSTCTL signal prior to its introduction to the delay and buffer circuit 18. The input to the delay and buffer circuit 18 could also be taken directly from the BOOSTCTL input, but the approach shown in FIG. 1 adds the delay of inverters N1 and N2 to the delay chain and reduces the number of delay devices required in delay and buffer circuit 18.

When the BOOSTCTL signal is low, the bottom terminal of ferroelectric capacitor Z1 (node 16) is held at the VDD level and the top terminal is held at ground. When boosting is required, the BOOSTCTL signal is driven high. The gate of transistor M2 is then driven to within a body-effected threshold voltage of VDD by conduction through transistor M0. With the BOOSTCTL signal high, the gate of transistor M1 goes low, and the charge stored at the VBOOST output is shared with the gate of transistor M2 via conduction through transistor M1 until the gate of M2 and VBOOST are at the same level. This charge sharing causes the VBOOST signal to fall from its original voltage, but ferroelectric capacitor Z1 helps to hold VBOOST very near to its VDD precharge level. With the gate of transistor M2 now charged to nearly VDD, transistor M2 is off and the VBOOST node is floating.

The purpose of delay and buffer circuit 18 is to ensure that the gate of transistor M2 and the VBOOST signal have equalized before the rising edge of the BOOSTCTL signal propagates through to the top terminal of ferroelectric boost capacitor Z1. The buffer controls the edge rate of the boost capacitor input signal. When the rising edge of BOOSTCTL appears at the top electrode of Z1, the floating VBOOST node is pushed above VDD. Because the gate of transistor M1 is held low, the gate of transistor M2 is charged up to the level of VBOOST, and transistor M2 stays off throughout the boosting process, thereby allowing VBOOST to exceed VDD by more than a threshold voltage. The final voltage reached by VBOOST is determined by the ratio between the capacitance of ferroelectric capacitor Z1 and the total capacitive load of the VBOOST node, which includes the gate capacitance of transistor M2 and the drain/source capacitances of transistors M1 and M2, in addition to the load of the circuit that requires the boosted voltage (not shown in FIG. 1).

In many cases, the amount of required boosting may change. For example, in one application, when VDD is 2.7V, a large amount of boosting is needed, but less is needed when VDD is 3.6V, and none is needed when VDD is above 4.5V. Another potential scenario involves using the same boost circuit to boost different nodes with different capacitive loads. Instead of reproducing the circuit for each node, the same circuit could be used and the boosted voltage routed to the desired node. Only the boost capacitors are switched in and out to determine the boost level.

Figure 2:
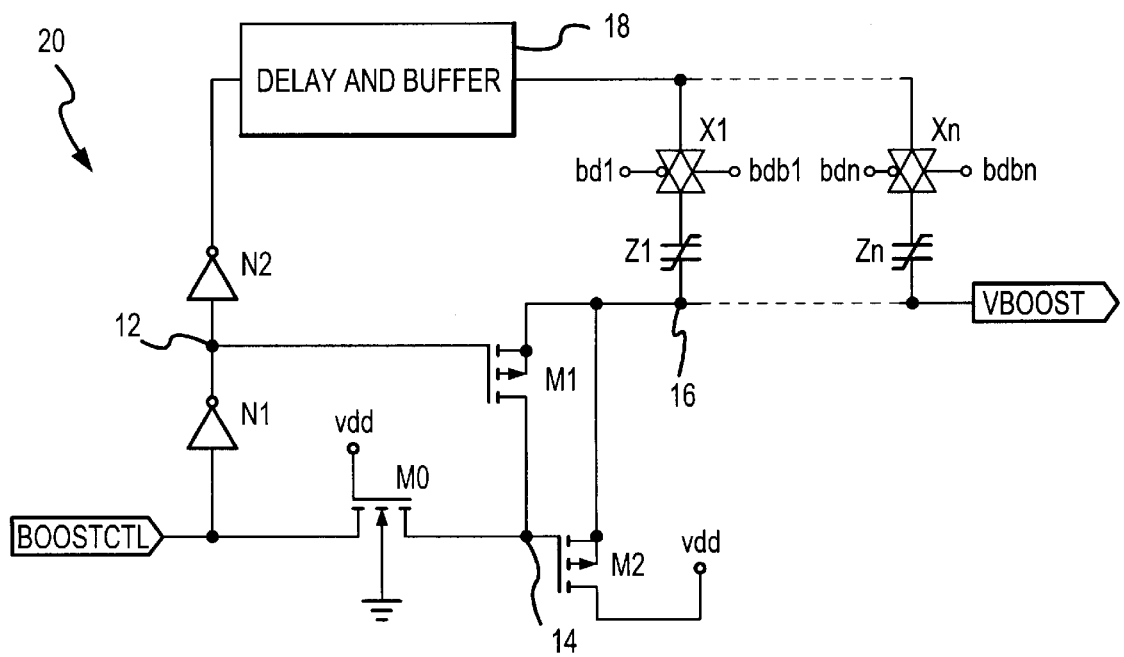
FIG. 2 is a schematic diagram of a second embodiment of a ferroelectric voltage boost circuit according to the present invention including two or more boost capacitors.

An expansion of the basic boosting circuit 10 is shown in boosting circuit 20 of FIG. 2. Boosting circuit 20 includes access to N (wherein N is an integer greater than or equal to two) different boost capacitors Z1–ZN controlled by a corresponding number of N different transmission gates X1–XN. In turn, each transmission gate X1–XN is controlled by two complementary control signals BD1/BDB1–BDN/BDBN. Full transmission gates MAN are selected to provide full discharge to ground and full driving voltage to VDD. Other types of access control devices can be used. The transmission gate control signals BD1/BDB1–BDN/BDBN shown in FIG. 2 are functionally boost disable signals. When a particular boost disable signal (BDX) signal is high and the corresponding complementary boost disable signal (BDBX) signal is low (the transmission gate signals are always complementary), the corresponding transmission gate XX is off, and the corresponding ferroelectric capacitor ZX is not used in the boost operation. The unused boost capacitors present only a small amount of additional load to VBOOST because of the series connection with the relatively small transmission gate capacitance.

Using two boost capacitors and transmission gates, four separate levels of boost are possible (including no boost). In general, there are $2^N$ possible boost levels, where N is the number of boost capacitors Z1–ZN. For the terraced boost approach described below, the boost capacitors are switched sequentially instead of providing boost levels corresponding to all possible "addresses." Using this approach, there are N+1 possible boost levels (including no boost).

Figure 3:
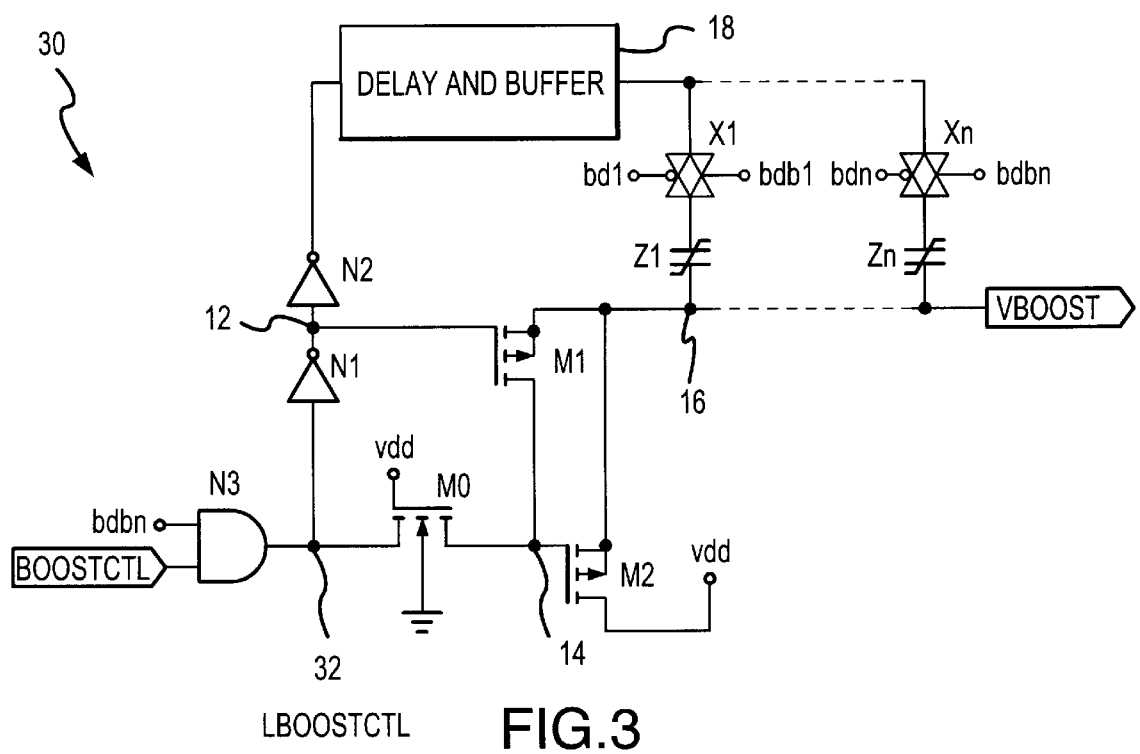
FIG. 3 is a schematic diagram of a third embodiment of a ferroelectric voltage boost circuit according to the present invention including two or more boost capacitors as well as additional circuitry to optimize no-boost performance by making direct contact between VDD and VBOOST.

If the "no boost" operation is used, there is no reason to ever float the VBOOST signal. When boosting follows the floating of VBOOST, the dip in VBOOST described above is more than made up for by the boost operation. If all transmission gates X1–XN in circuit 20 of FIG. 2 are turned off, the boost operation is disabled, and the dip to VBOOST does not recover. Therefore, the voltage at VBOOST is slightly reduced from VDD. To eliminate this undesirable dip, the BOOSTCTL signal can be gated with the transmission gate control signal or signals. When all transmission gates are off, the local boost control signal can be inhibited as shown in FIG. 3. For sequential boost levels (N+1 boost levels), only one transmission gate control signal is required in the inhibit logic. For fully addressable boost levels ($2^N$ boost levels), all transmission gate control signals are required in the BOOSTCTL inhibit logic.

Boost circuit 30 of FIG. 3 shows an additional AND gate N3 for gating the BOOSTCTL signal with the BDBN control signal. The logical AND combination of the BOOSTCTL and BDBN signals creates the LBOOSTCTL signal, which is the local boost control node 32. In circuit 30, boost capacitors Z1–ZN are sequentially activated. In the circuit implementation shown in boost circuit 30, the Nth ferroelectric capacitor stage ZN turns on first. For the next higher boost level, both the Nth and (N−1)th boost capacitors ZN and Z(N−1) are activated. For the highest boost level, all of the Nth, (N1)th, . . . , through the 1st ferroelectric boost capacitors are used. If BDBN is low, BDB(N1) through BDB1 are also low, so only the BDBN signal is required to validate BOOSTCTL. The generation of the BD and BDB signals in the terraced boost approach are described below in further detail.

In the basic boost circuit 10 shown in FIG. 1, the BD and BDB control signals are not used since there is only a single ferroelectric boost capacitor Z1, and therefore VDD is applied across ferroelectric capacitor Z1 the entire time the BOOSTCTL signal is low. Similarly, in boost circuit 20 shown in FIG. 2, VDD is applied across a particular ferroelectric capacitor ZX whenever BOOSTCTL is low and the corresponding transmission gate XX is on. And again, in boost circuit 30 shown in FIG. 3, VDD is applied across a ferroelectric capacitor ZX whenever BOOSTCTL or BDBn is low and transmission gate XX is on.

Figure 4:
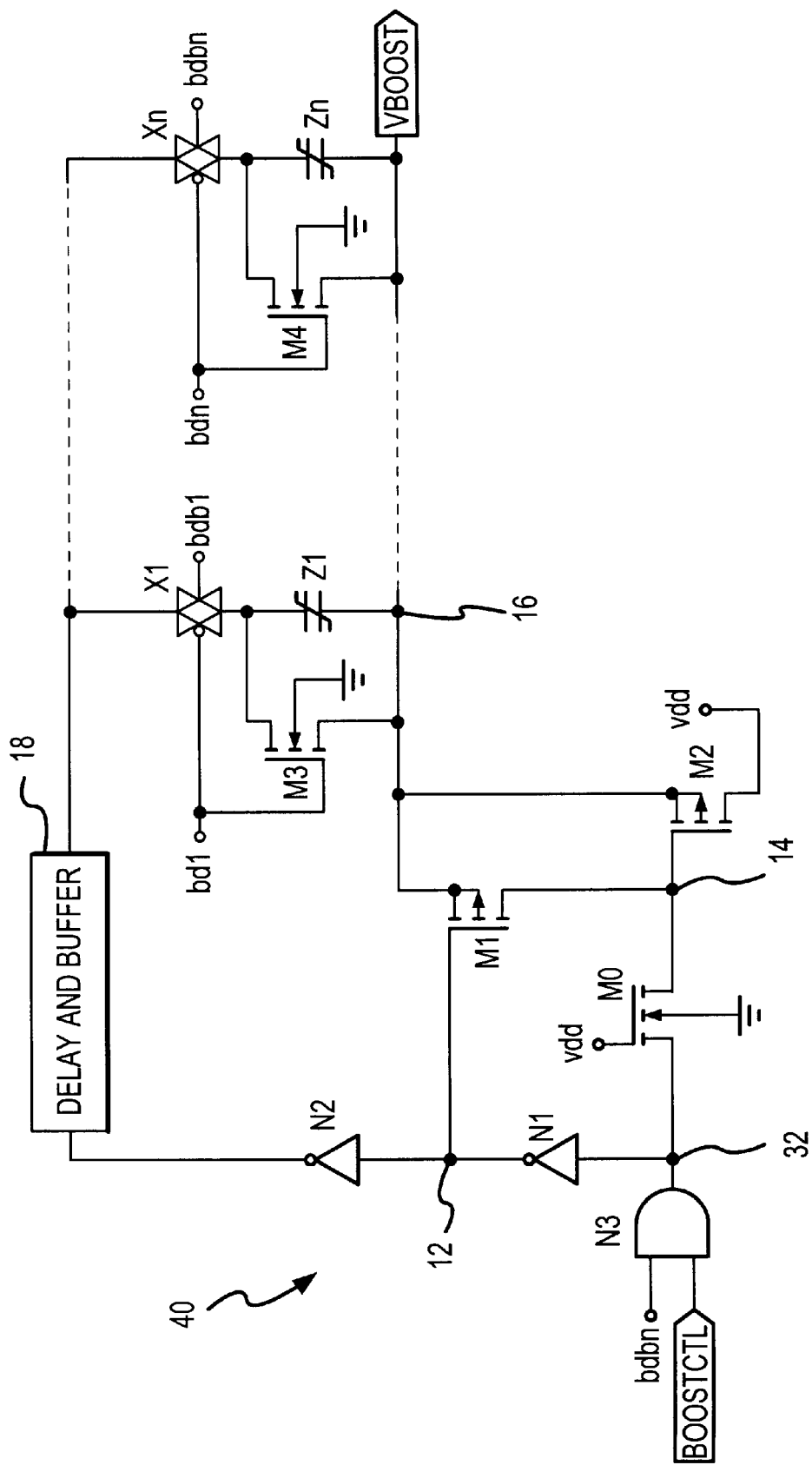
FIG. 4 is a schematic diagram of a fourth embodiment of a ferroelectric voltage boost circuit similar to the third embodiment boost circuit, but including circuitry to help alleviate time-dependent dielectric breakdown of the ferroelectric boost capacitors.

For capacitor dielectrics, time-dependent dielectric breakdown (TDDB) is a potential reliability concern. Boost circuit 40 in FIG. 4 shows the addition of N-channel shorting transistors M3 and M4 to alleviate TDDB concerns. When boosting is not needed, all the BDB signals are set low and all the BD signals are set high to turn off the transmission gates. The high BD signals also turn on the shorting transistors M3 through M4. (It is appreciated by those skilled in the art that additional N-channel shorting transistors can be used corresponding to additional ferroelectric capacitor stages.) Shorting transistors M3 through M4 are used to establish a small known voltage across the boost capacitors Z1–ZN. By controlling BDB and BD timing, near VDD bias levels can be maintained on the top node of Z1–ZN, resulting in a low DC bias across the ferroelectric capacitors.

The timing of the BD and BDB signals is important for proper circuit operation. Before boosting can occur, the top electrode of the selected boost capacitors Z1–ZN are ideally pulled low by activating transmission gates X1–XN. Bringing BDBX high and BDX low simultaneously disconnects the shorting transistor MX and pulls the top electrode of capacitor ZX low in preparation for boosting. Pulling down the top electrodes of boost capacitors Z1–ZN causes some disturb to VBOOST, but VBOOST is restored to VDD through transistor M2 if sufficient setup time is allowed.

N-channel transistors M3–M4 are chosen over P-channel transistors so that the logic controlling the shorting transistors does not have to operate at a boosted voltage level. The N-channel shorting transistors M3–M4 can only equalize the top and bottom electrodes of the boost capacitors Z1–ZN to within a body-effected threshold. This voltage level, however, is significantly less than VDD, and eliminates TDDB concerns.

Figure 5A:
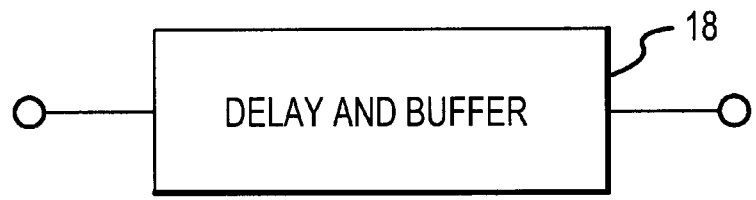
FIG. 5A is a block diagram of a delay and buffer circuit used in the boost circuits of the present invention.
Figure 5B:
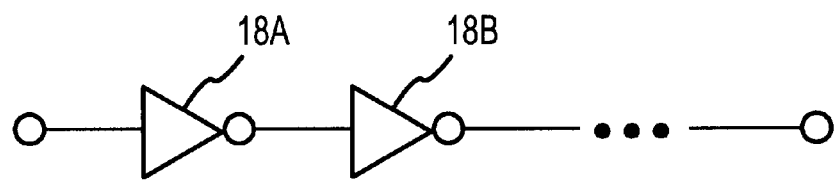
FIG. 5B is a circuit diagram of a gate-level implementation of the delay and buffer circuit shown in FIG. 5A.

The delay and buffer circuit 18 described above with respect to FIGS. 1–4, and shown in isolation in FIG. 5A can be any circuit known to those skilled in the art that meets the desired functional goals. The delay circuit 18 should ideally provide sufficient delay between the rising edge of the BOOSTCTL signal and the top electrode of the boost capacitors being driven high to ensure that transistor M2 is off and VBOOST is completely isolated from VDD. The buffer portion of the delay and buffer circuit 18 should be optimized based on design goals for the edge rate of the VBOOST signal. In the most simple implementation, the delay and buffer operation is achieved by an even number of series inverters 18A and 18B shown in FIG. 5B whose drive strength is appropriately stepped up to meet the specific drive requirements of the application. As described earlier, the series combination of inverters N1 and N2 may be sufficient delay and buffer for some applications, thereby eliminating the need for any additional delay and buffer devices.

Figure 6:
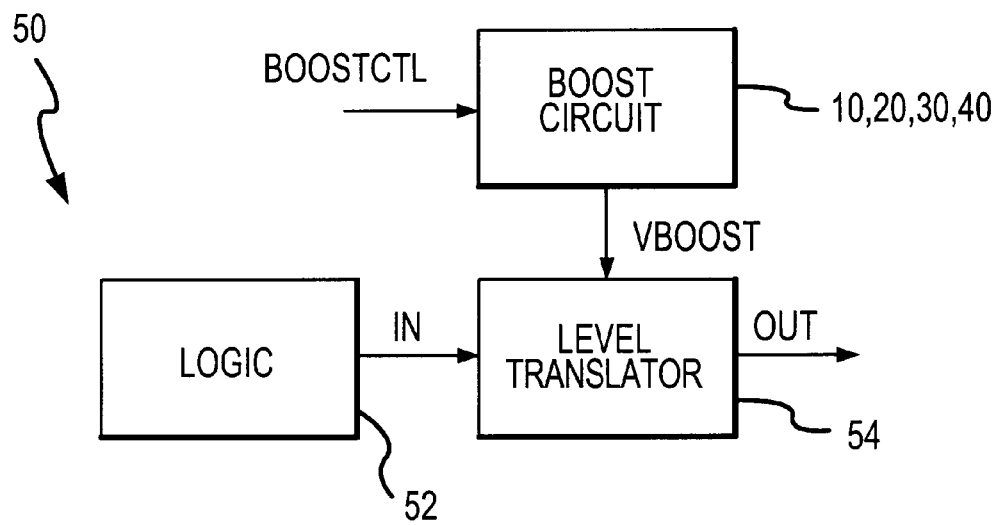
FIG. 6 is a circuit configuration using the boost circuits of the present invention and further including a level translator circuit.
Figure 7:
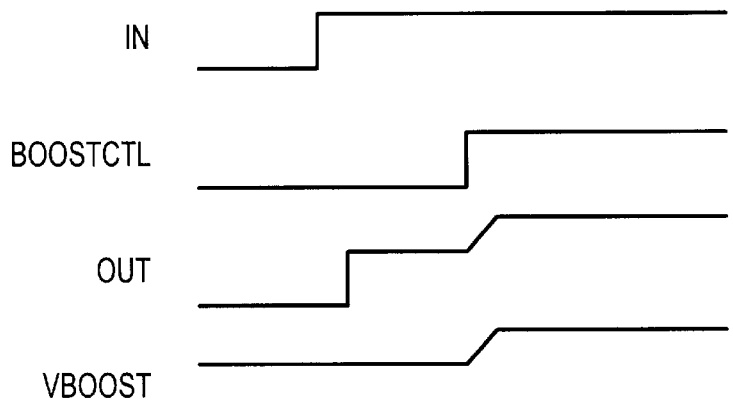
FIG. 7 is a timing diagram associated with the circuit configuration of FIG. 6.

FIG. 6 depicts a circuit configuration 50 that uses a level translator circuit 54 in conjunction with the boost circuits 10, 20, 30, 40 described previously to boost a logic signal. The boost circuits disclosed have two levels, VDD or VBOOST, but do not have a logic low level (e.g., ground). Logic signals are characterized by both logic one and logic zero voltage levels. The level translator circuit 54 allows a logic one signal to be boosted to the VBOOST voltage level. Since the boost circuit 10–40 generates a floating boosted voltage, VBOOST, the logic IN signal generated by logic circuit 52 should be changed before BOOSTCTL rises, as shown in the timing diagram of FIG. 7. The timing of the IN, BOOSTCTL, OUT, and VBOOST signals shown in FIG. 7 ensures that no DC current is drawn from the output of VBOOST. If the IN signal were to change after BOOSTCTL had risen, the voltage on the floating VBOOST node would be significantly reduced by the DC current peak typical to switching CMOS devices.

Figure 8:
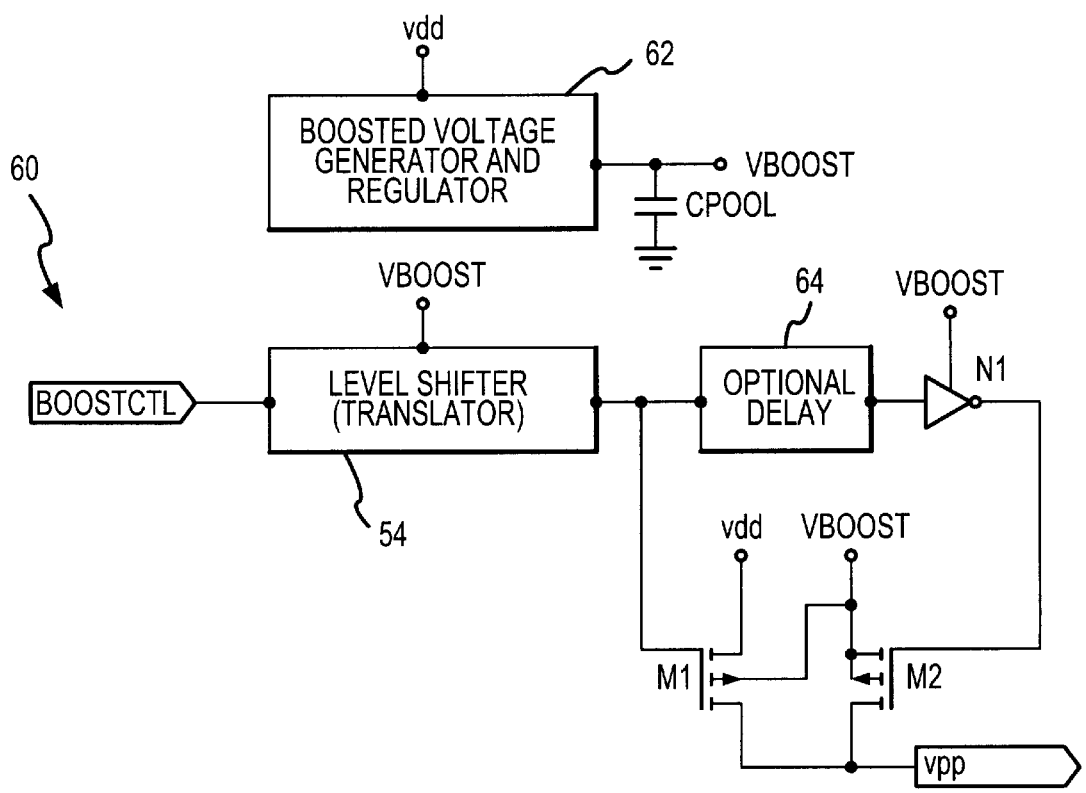
FIG. 8 is a circuit configuration using the boost circuits of the present invention in a "charge pool" configuration.

The circuitry depicted in FIG. 6 can be applied to the word line decoder of a ferroelectric memory to generate boosted word line voltages. Two possible approaches are possible. The first approach involves using the previously disclosed boost circuits 10–40 to generate a local VPP supply voltage to the word-line drivers. In this approach, VPP would be equal to VDD when BOOSTCTL is low and then boosted when BOOSTCTL goes high. A second possible approach to sharing the boosted supply voltage among several devices is to create a boosted and regulated VBOOST supply level using a multi-stage charge pump 62 consisting of previously described boost circuits 10–40 and a load capacitor Cpool (which can be located either on-chip or offchip) to create a "charge pool" or an internal non-switched boosted voltage supply. This charge pool circuit 60 is shown in FIG. 8. This charge pool voltage (VBOOST) is always maintained slightly above the desired VPP level, and boosting is accomplished by charge sharing with the node requiring boosting. To limit the current drawn from the charge pool, VPP is tied to VDD when the input logic signals are changing and then switched to VBOOST when BOOSTCTL goes high. In the first approach to generate a shared VPP, BOOSTCTL triggered the boost operation, while in the second approach, a boosted voltage is always maintained, and the BOOSTCTL signal simply switches between the two available supply levels.

Analyzing the charge pool configuration 60 shown in FIG. 8, when BOOSTCTL is low, the gate of transistor M1 is low and the gate of transistor M2 is pulled up to VBOOST. So, when BOOSTCTL is low, VPP is tied to VDD through M1, and M2 is off, isolating VBOOST from VPP. When BOOSTCTL rises, the gate of M1 is driven to VBOOST so that M1 turns off and stays off when VPP is driven to VBOOST. A short optional delay circuit 64 ensures that M1 is off before the gate of M2 is pulled low and M2 begins to turn on. With M2 on, VPP begins charging to VBOOST. The charge pool capacitor, Cpool, acts to hold VBOOST near its regulated level and isolates the charge pump and regulator circuit 62 from current peaks. Inverter N1 is designed to minimize the current draw from VBOOST during the switchover from VDD to VBOOST. Inverter N1 can be replaced with a true break-then-make inverter circuit if desired to further ensure the goal of current reduction.

A terraced boost method is described below wherein voltage boosting is automatically adapted to the voltage range of the external power supply so that the internal boosted voltage is kept within predetermined acceptable levels.

As previously described, the move of the electronics industry to lower system supply voltages to 2.7 volts and below has resulted in the need for nonvolatile memories that operate at these lower supply voltages. To date, commercial FRAM memories have been specified to operate generally at 5V±10%. Currently, new low-voltage ferroelectric material development is under way that has the potential to be fully operational at the low power supply voltages. However, the reliability of these new ferroelectric materials has yet to be characterized in products, and the availability date of the new materials is uncertain. Therefore, designs that offer operation down to an external supply voltage 2.7V, yet still use mature 5V ferroelectric materials and processing are an important transition phase for ferroelectric memory products.

In order to approach the desirable ferroelectric retention characteristics achieved on previous memory designs, the ferroelectric storage capacitors in the memory cells should be written to and read at the same voltages. This goal requires boost circuitry as described for both the memory cell plate-lines and sense-amplifiers.

Figure 9:
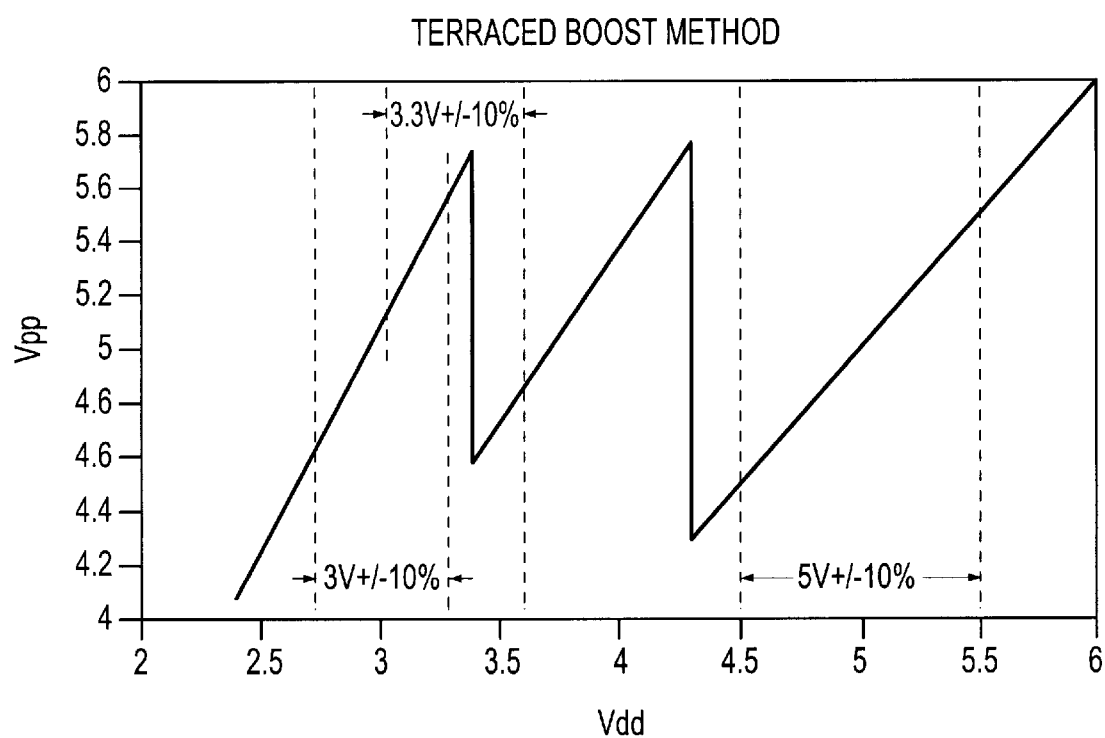
FIG. 9 is a graph of the internal boosted voltage versus the external power supply voltage showing three distinct boosting modes depending upon the external power supply voltage level.

One shot capacitive boosting can achieve the desired voltage levels. Unlike word-line boosting in previous FRAM products, boost clamping is not used. Instead, a terraced boost method described below generates boosted supply levels within a predetermined desired voltage window. The diagram of FIG. 9 shows the approximate transfer function for the terraced boost approach. Industry standard supply voltage ranges from between about 2.5 volts to about six volts are shown for reference.

The X-axis of FIG. 9 represents the external system supply voltage, VDD, while the Y-axis represents the internal boosted supply voltage, VPP. Boosting occurs at three distinct levels. These levels are divided as follows: full-boost (VDD<3.4V), mid-boost (3.4V<VDD<4.3V), and no-boost (VDD>4.3V). Additional and/or different boost levels can be implemented if desired to keep VPP between about 4.5V and 5.5V or any other desired voltage window for all VDD values between 2.5 V and 5.5 V or any other VDD ranges as desired. Design compromise is chosen to reduce the number of boost levels and the subsequent integrated circuit area. This engineering compromise required an extension to the window of acceptable read and write voltages from about 4.2 volts to about 5.8 volts.

During power-up read and restore operations, which occur between about 2.40 volts and 2.54 volts, full-boost is required to elevate the local supply voltage VPP above 4.2V. This corresponds to a boost ratio of approximately 1.7. As VDD increases, the boost ratio causes VPP to also increase. By the time VDD reaches 3.4V, the internal boost voltage is boosted to nearly 5.8V. Since excessive voltage can result in premature fatigue of ferroelectric capacitors, VPP cannot be allowed to stray too far above 5.5V. So, near a VDD of 3.4V, the boost circuitry switches from full-boost to mid-boost.

The next transition between mid-boost and no-boost occurs near a VDD voltage of about 4.3V. This level was selected so that no boost transitions would occur in the 5V±10% region. To achieve a maximum boosted voltage of 5.8V when VDD is 4.3V, a mid-boost ratio around 1.35 is needed.

Figure 10A:
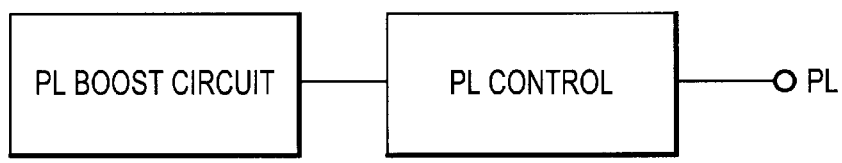
FIG. 10A is a block diagram of a portion of a ferroelectric memory circuit in which the plate lines and sense amplifiers are boosted independently.
Figure 10A:
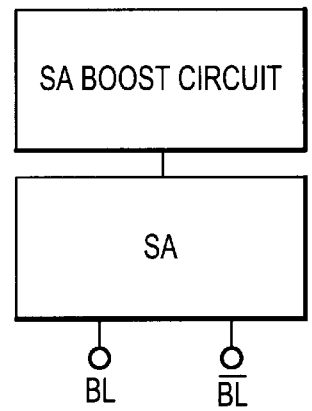
Figure 10B:
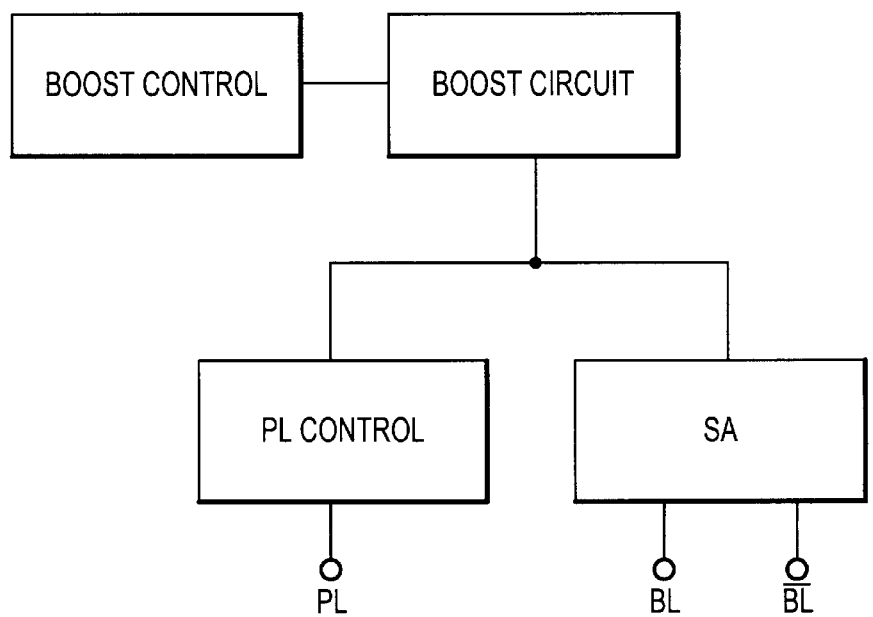
FIG. 10B is a block diagram of a portion of a ferroelectric memory circuit in which the plate lines and sense amplifiers are boosted via shared boosting a control circuitry.

It is desirable that the sense amplifier supply voltage and plate-line voltages are boosted independently in order to simplify the circuitry and timing of the boost circuits, as shown in the block diagram of FIG. 10A. During interrogation the plate-line voltage should ideally be boosted when the sense amplifier is off. During restoration of the read state, the plate-line voltage is ideally boosted when the sense amplifier is on. If the same boosted supply were shared for both the sense amplifier and plate-line as shown in the block diagram of FIG. 10B, the load for the boost circuitry would be significantly different during different portions of the access. To achieve the same boost level for both conditions using a shared boosted supply requires more complex boost and boost control circuitry to control the boost level. Furthermore, during a read, the sense amplifier is ideally boosted when the plate-line is low, and then the plate-line is brought high to the boosted level. The switching of the plate-line introduces a short time of high current draw that would sharply decrease a floating boosted voltage. For this case, a shared boosted supply would need to be tied to VDD for the plate-line transition and then be boosted again, which would significantly increase the control signal and timing complexity.

To avoid the complexities described above, the sense amplifier and plate-line boosted supplies are generated separately as shown in the block diagram of FIG. 10A. Every time the plate-line rises, the local plate-line supply voltage is boosted. This approach does introduce a potential risk of back-switching ferroelectric storage capacitors if the boosted sense amplifier voltage exceeds the boosted plate-line voltage. Therefore, care was taken throughout the design to ensure that the boosted plate-line voltage nominally exceeds the boosted sense amplifier voltage slightly.

The goal of the terraced boost method is to maintain the boosted voltage level, VPP, within a desired window over a wide range of supply voltages. While analog voltage limiting circuits work well for controlling low frequency variations, they are not practical for meeting the fast response times required in one-shot boosting. Simple voltage clamps can meet the required response time, but the variation of device parameters over process and temperature makes meeting the desired VPP window requirements extremely difficult. The terraced boost method of the present invention controls the final boosted voltage level at the front end by controlling the boost capacitance based on the VDD supply voltage.

Figure 12:
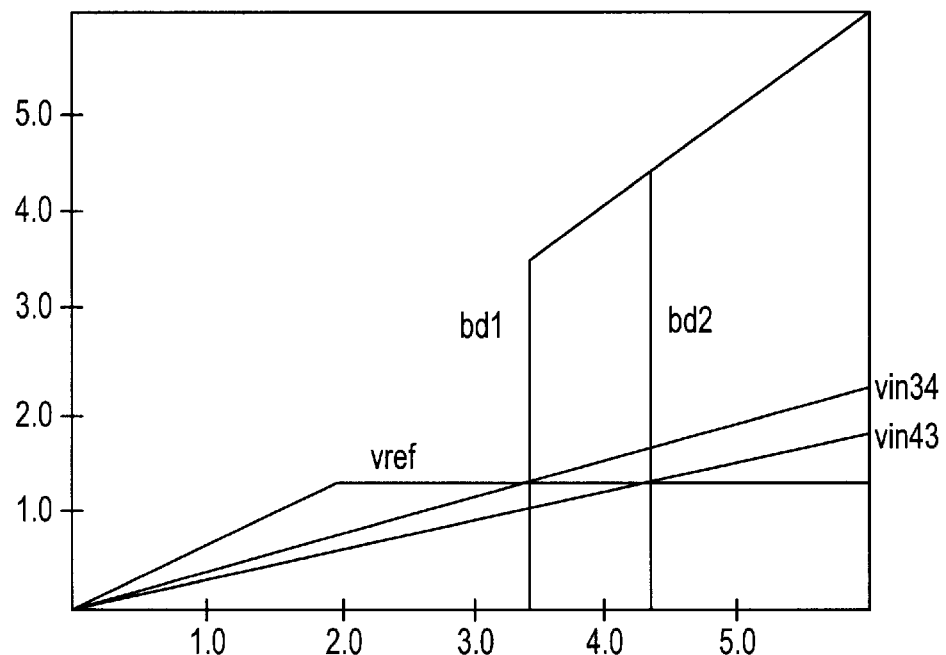
FIG. 12 is a graph of various internal and reference voltages associated with the terraced boost control circuit of FIG. 11.

The terraced boost control method of the present invention is accomplished by selectively disabling the boost capacitors (see FIGS. 3 and 4) via the boost disable signals, BD1 through BDN, and their complements. A reference generator circuit 70 generates a reference voltage, VREF, which is fed to the negative terminals of comparators 72 and 74. A resistor divider R1, R2, R3, creates detection voltages VIN34 and VIN43 proportional to the VDD supply voltage. The resistor divider R1–R3 is designed so that the detection voltage VIN34 or VIN43 crosses the VREF level when the VDD supply voltage exceeds the ceiling of a boost voltage range (see FIG. 12).

Figure 11:
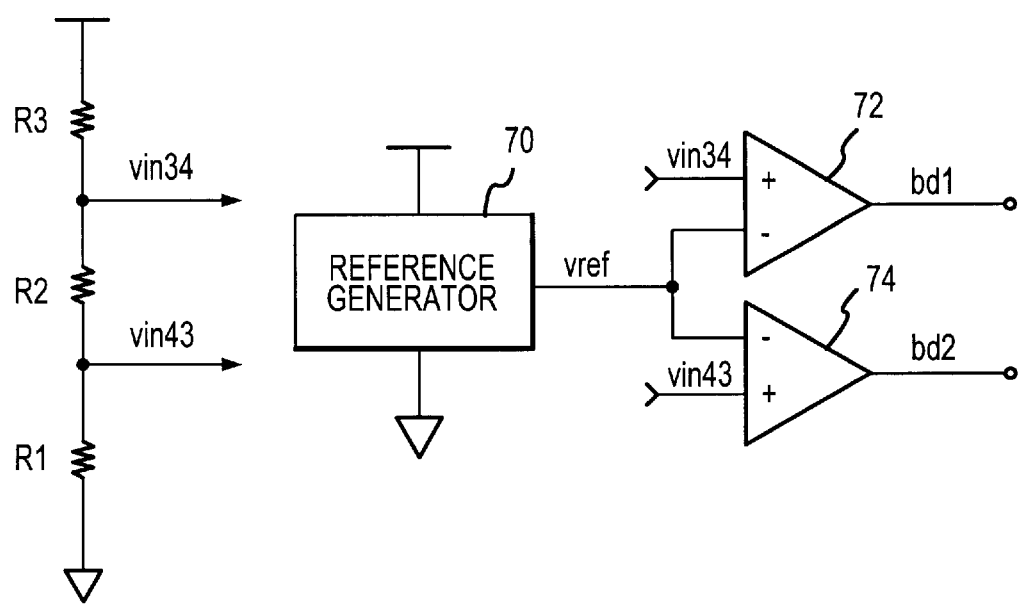
FIG. 11 is a schematic diagram of additional circuitry required to achieve the terraced boost method shown in FIG. 9.

In the circuit example shown in FIG. 11, two boost disable signals BD1 and BD2 are used. Referring again to FIG. 12, as the VDD supply voltage rises, the reference voltage, VREF, quickly rises to its final level, while the divider voltages, VIN34 and VIN43, remain lower. A typical reference reaches a final value of about 1.25 V by the time the supply voltage reaches 2.0 V. In this example, the first detection voltage is set at about 3.4 V, and the second detection voltage is set at about 4.3 V. When the supply voltage is below 3.4 V, both VIN3 and VIN4 are below VREF, and both BD1 and BD2 are low. As a result, any boost operation occurring below 3.4 V will use both ferroelectric boost capacitors. Similarly, between 3.4 V and 4.3 V, BD1 is high and boost operations will use a single boost capacitor. Finally, when the supply voltage exceeds 4.3 V, no boost capacitors are used.

Having described and illustrated the principle of the invention in a preferred embodiment thereof, it is appreciated by those having skill in the art that the invention can be modified in arrangement and detail without departing from such principles. For example, the number of boosting stages, voltage levels, boost ratios, number and nature of the boosting capacitors, polarity of the transistors, and number and nature of the control signals can be changed as desired for a particular low-voltage power supply application. I therefore claim all modifications and variations coming within the spirit and scope of the following claims.

I claim:

1. A voltage boosting circuit (10) comprising:
   an output node for providing a boosted voltage (VBOOST) greater than an external power supply voltage (VDD);
   a P-channel transistor (M2) having a gate and a current path for selectively connecting the output node to the external power supply voltage or for isolating the output node from the external power supply voltage;
   means (M0, M1, N1) for pulling the gate of the Pchannel transistor to the boosted voltage level (VBOOST);
   a ferroelectric capacitor (Z1) having a first electrode connected to the output node; and
   means for driving a second electrode of the ferroelectric capacitor from low to high when the output node is isolated from the external power supply voltage (N2, optional delay and buffer).

2. A voltage boosting circuit comprising:
   an input node;
   an output node;
   an internal circuit node;
   a dual inverter circuit having an input coupled to the input node, an output, and a center tap;
   a delay circuit having an input coupled to the output of the dual inverter circuit and an output;
   ferroelectric capacitor means having a first node coupled to the output of the delay circuit and a second node coupled to the output node;
   a first transistor having a current path coupled between the input node and the internal circuit node, and a gate coupled to a source of supply voltage;
   a second transistor having a current path coupled between the output node and the internal circuit node, and a gate coupled to the center tap of the dual inverter circuit; and
   a third transistor having a current path coupled between the output node and the source of supply voltage, and a gate coupled to the internal circuit node.

3. A voltage boosting circuit as in claim 2 in which the first transistor comprises an N-channel transistor.

4. A voltage boosting circuit as in claim 2 in which the second transistor comprises a P-channel transistor.

5. A voltage boosting circuit as in claim 2 in which the third transistor comprises a P-channel transistor.

6. A voltage boosting circuit as in claim 2 in which the ferroelectric capacitor means comprises a ferroelectric capacitor.

7. A voltage boosting circuit as in claim 2 in which the ferroelectric capacitor means comprises a plurality of ferroelectric capacitors.

8. A voltage boosting circuit as in claim 2 in which the ferroelectric capacitor means comprises a plurality of ferroelectric capacitors in series connection with a corresponding transmission gate.

9. A voltage boosting circuit as in claim 8 in which each of the transmission gates is individually controlled by a boost disable control signal.

10. A voltage boosting circuit as in claim 2 in which the ferroelectric capacitor means comprises a plurality of ferroelectric capacitors having a corresponding shorting transistor in series connection with a corresponding transmission gate.

11. A voltage boosting circuit as in claim 10 in which each of the transmission gates and shorting transistors is individually controlled by a boost disable control signal.

12. A voltage boosting circuit as in claim 2 in which the delay circuit comprises a pair of serially connected inverters.

13. A voltage boosting circuit as in claim 2 further adapted for use with a level translator circuit for generating a logic signal in which the logic zero level is ground voltage and the logic one level is equal to the boosted voltage.

14. A voltage boosting circuit as in claim 2 further adapted for use with a voltage regulator for generating a constant boosted voltage level and a switch for selectively applying the constant boosted voltage level to a local power supply output.

15. A voltage boosting circuit as in claim 2 further adapted for use with a means for adjusting the boost ratio as a function of an external power supply voltage.

16. A voltage boosting circuit as in claim 15 in which the boost ratio is adjusted to maintain a voltage on the output node between about 4.5 volts to about 5.5 volts.

17. A voltage boosting circuit as in claim 15 in which the external power supply voltage ranges from about 2.5 volts to about 5.5 volts.

18. A voltage boosting circuit as in claim 15 in which the boost ratio is terraced in three distinct levels depending upon the value of the external power supply voltage.

19. A voltage boosting circuit as in claim 15 in which the means for adjusting the boost ratio comprises:
   a resistor divider for generating a first and second voltage proportional to the external power supply voltage;
   a reference generator for generating a reference voltage; and
   first and second comparators having inputs for receiving the first and second voltage and the reference voltage, and outputs coupled to the ferroelectric capacitor means.

20. A method for operating a ferroelectric memory in a low voltage external power supply environment comprises:
   floating a local supply voltage and using a single boost via an appropriately sized ferroelectric boost capacitor to elevate the local supply level to the desired boosted voltage greater than the low voltage external power supply voltage;
   adjusting the amount of boost as a function of the external power supply voltage; and
   tying the local supply voltage to the power supply through a large PMOS transistor when boosting is not required.

* * * * *